(12) United States Patent
Hanaoka et al.

(10) Patent No.: US 8,749,001 B2
(45) Date of Patent: Jun. 10, 2014

(54) ELECTRONIC COMPONENT, ELECTRONIC DEVICE, AND METHOD OF MANUFACTURING THE ELECTRONIC COMPONENT

(75) Inventors: Terunao Hanaoka, Suwa (JP); Akinori Shindo, Hokuto (JP); Yasuo Yamasaki, Shiojiri (JP); Seiichi Chiba, Mihowa-machi (JP); Toshiyuki Enta, Akumi-gun (JP); Shuji Kojima, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 148 days.

(21) Appl. No.: 13/228,989

(22) Filed: Sep. 9, 2011

(65) Prior Publication Data

US 2012/0080763 A1   Apr. 5, 2012

(30) Foreign Application Priority Data

Sep. 30, 2010   (JP) ................................ 2010-220809

(51) Int. Cl.
*H01L 21/00* (2006.01)
*G01P 15/097* (2006.01)

(52) U.S. Cl.
USPC .... 257/417; 257/E29.324; 438/51; 73/504.14

(58) Field of Classification Search
CPC ...................... G01P 15/097; B81B 2201/0242
USPC .......... 257/417, E29.324; 438/51; 73/504.14, 73/503.3
See application file for complete search history.

(56) References Cited

U.S. PATENT DOCUMENTS

| | | | | |
|---|---|---|---|---|
| 5,557,045 | A * | 9/1996 | Ishitoko et al. | ............ 73/504.14 |
| 7,714,410 | B2 | 5/2010 | Hanaoka | |
| 2003/0070483 | A1* | 4/2003 | Mueller | ........................... 73/493 |
| 2006/0267189 | A1* | 11/2006 | Usui et al. | ..................... 257/723 |
| 2008/0277758 | A1 | 11/2008 | Hanaoka | |
| 2009/0146227 | A1* | 6/2009 | Igarashi | ........................ 257/415 |

FOREIGN PATENT DOCUMENTS

| | | |
|---|---|---|
| JP | A-2005-292079 | 10/2005 |
| JP | A-2006-229121 | 8/2006 |
| JP | A-2008-283038 | 11/2008 |
| JP | A-2009-105462 | 5/2009 |

* cited by examiner

*Primary Examiner* — Steven J Fulk
(74) *Attorney, Agent, or Firm* — Oliff PLC

(57) ABSTRACT

An electronic component includes: a semiconductor element including a circuit; a vibration element; a first electrode arranged on a first surface of the semiconductor element and connected to the circuit and the vibration element arranged on the first surface side; a second electrode arranged on the first surface; a first wiring board including a first wire connected to the second electrode; and a second wiring board including a second wire to which the first wire is connected. At least a part of an inner side region of an outer contour of the vibration element is arranged to overlap the second electrode in plan view facing the first surface.

14 Claims, 8 Drawing Sheets

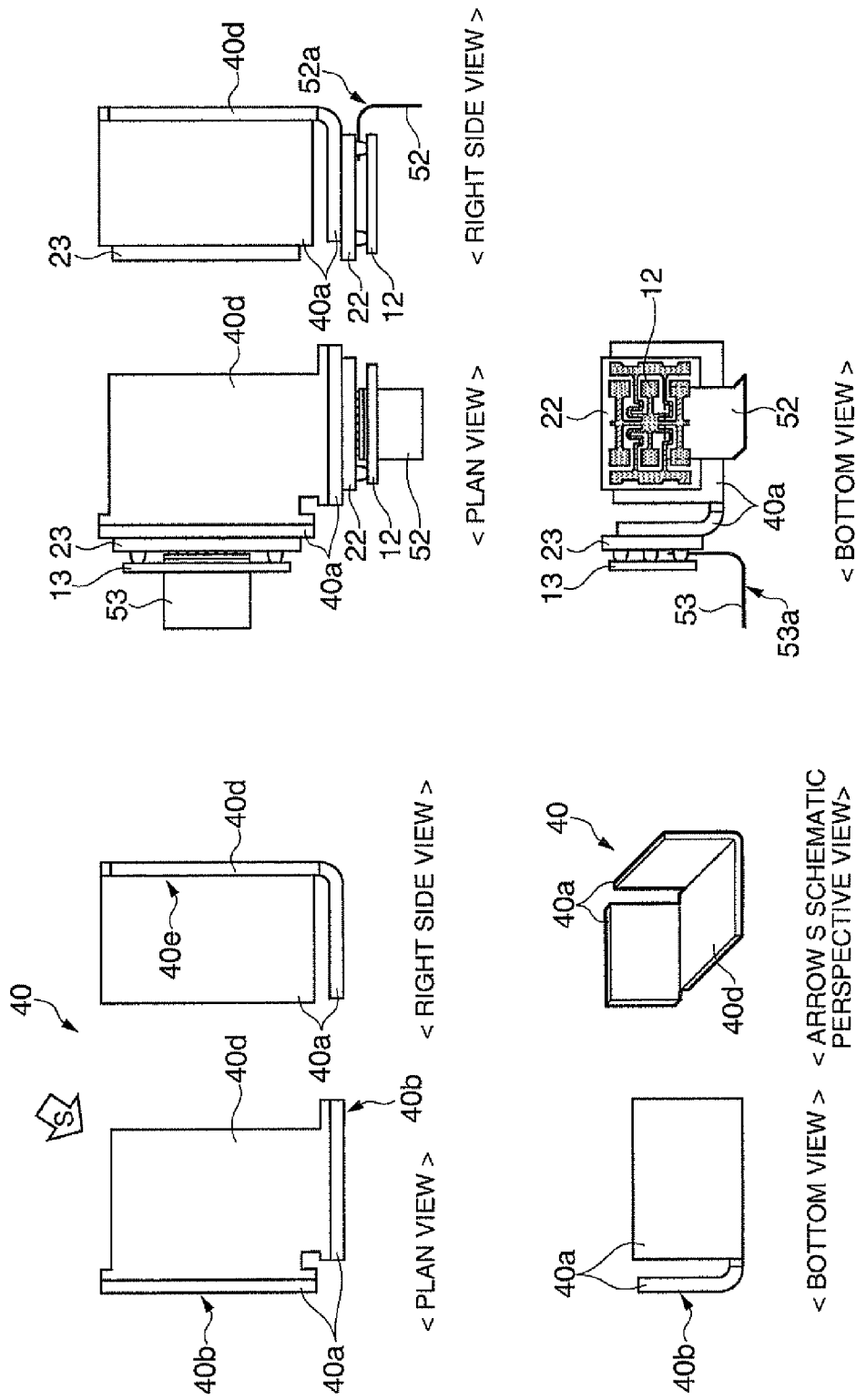

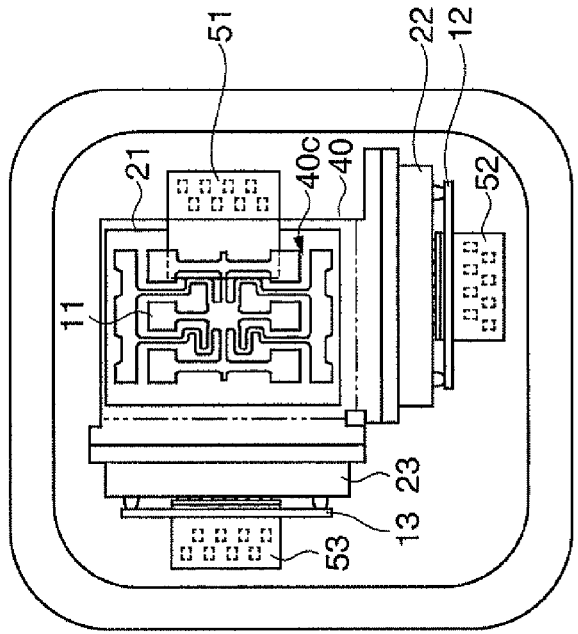
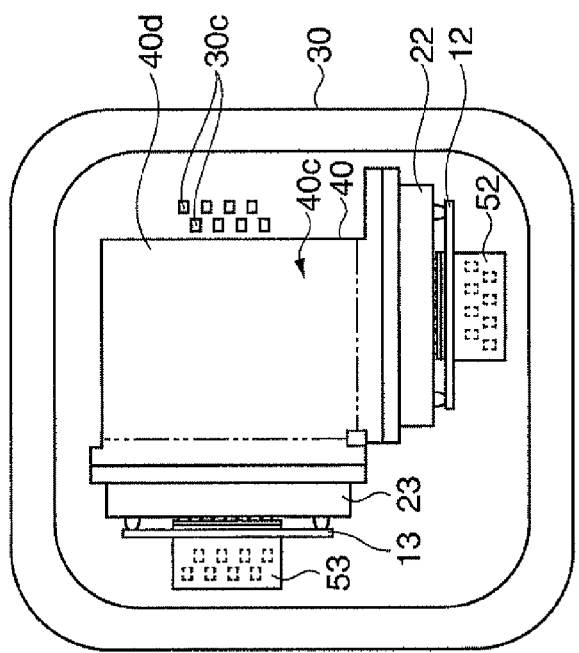
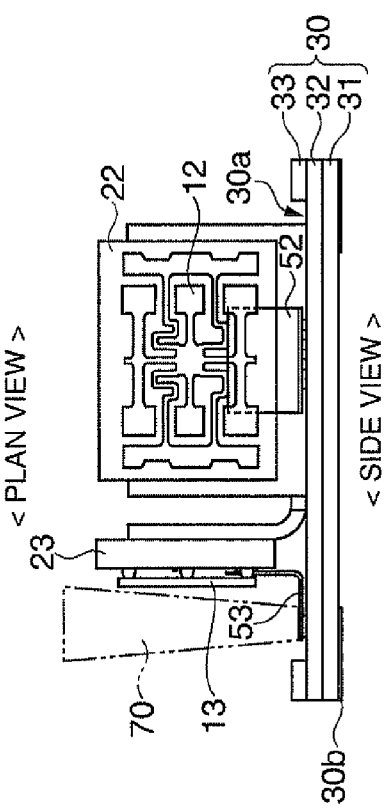
FIG. 7A
FIG. 7B

ELECTRONIC COMPONENT, ELECTRONIC DEVICE, AND METHOD OF MANUFACTURING THE ELECTRONIC COMPONENT

The entire disclosure of Japanese Patent Application No. 2010-220809, filed Sep. 30, 2010 is expressly incorporated by reference herein.

BACKGROUND

1. Technical Field

The present invention relates to an electronic component, an electronic device, and a method of manufacturing the electronic component, 2. Related Art In recent years, a sensor device including a sensor element and a function of driving the sensor element is widely known as an electronic component including a piezoelectric element. For example, JP-A-2005-292079 discloses a gyro sensor (a piezoelectric oscillator) in which a sensor device including a gyro vibration piece functioning as a sensor element and a semiconductor device (hereinafter referred to as semiconductor substrate) functioning as a circuit element is housed in a package.

In this configuration, the semiconductor substrate is fixedly attached to a supporting substrate and electrically connected to a lead wiring section formed on the supporting substrate. The sensor element (the gyro vibration piece) is connected to a lead wire fixedly attached to the supporting substrate to thereby be arranged to keep a gap between the sensor element and the semiconductor substrate and overlap the semiconductor substrate in plan view.

However, in JP-A-2005-292079, in order to reduce the influence on the sensor element due to an impact applied from the outside or the like, elasticity is imparted to the lead wire and the impact applied from the outside is absorbed by a bend of the lead wire. Therefore, in the gyro sensor, it is necessary to provide a gap exceeding a bending amount of the lead wire between the semiconductor substrate and the sensor element to prevent the Semiconductor substrate and the sensor element from interfering with each other even if the lead wire is bent by the impact applied from the outside. As a result, the thickness of the sensor device increases and the total thickness of the gyro sensor increases.

SUMMARY

An advantage of some aspects of the invention is to solve at least one of the problems described above, and the invention can be implemented as the following forms or application examples.

Application Example 1

This application example of the invention is directed to an electronic component including: a semiconductor element including a circuit; a vibration element; a first electrode arranged on a first surface of the semiconductor element and connected to the circuit and the vibration element arranged on the first surface side; a second electrode arranged on the first surface, at least a part of an inner side region of an outer contour of the vibration element being arranged to overlap the second electrode in plan view facing the first surface; a first wiring board including a first wire connected to the second electrode; and a second wiring board including a second wire to which the first wire is connected.

According to this application example, on the first surface of the semiconductor element mounted with the vibration element, a connection electrode to a wiring board connected to a wire of a substrate to be mounted is formed on the inner side of the region of the outer contour of the vibration element Therefore, an electrode is not formed on the outside of the region of the outer contour of the vibration element. The vibration element can be mounted on the semiconductor element that does not have a useless region on the outside of the region of the vibration element. Therefore, it is possible to use a smaller semiconductor element and realize a reduction in size of an electric component and improvement of productivity of semiconductor elements (increase the number of semiconductor elements cut from one wafer).

Application Example 2

This application example is directed to the electronic component of the above application example, wherein a wiring surface of the second wiring board on which the second wire is formed and the first surface of the semiconductor element are arranged to cross each other.

Since the first wiring board is used, a step of connecting the first wiring board and the semiconductor element and a step of connecting the first wiring board and the second wiring board can be carried out as separate steps. Even when an active surface of the semiconductor element and a mounting surface of the second wiring board are mounted to cross each other, it is possible to facilitate connection of the first wiring board and the semiconductor element irrespective of an angle of the crossing.

Application Example 3

This application example is directed to the electronic component of the above application example, which further includes a metal member that covers the semiconductor element and the vibration element and is connected to the second wiring board, the first surface of the semiconductor element is a rectangle having a first side and a second side opposed to the first side, a distance between the second side and the metal member is shorter than a distance between the first side and the metal member, the first electrode includes a third electrode for signals that detects vibration of the vibration element and is arranged closer to the second side than the first side, and the second electrode is located closer to the first side than the second side.

When the active surface of the semiconductor element and the mounting surface of the second wiring board are mounted to cross each other, since the third electrode, which is an electrode for driving wiring, is arranged close to a sealing member of the metal member, it is possible to suppress an influence due to external noise.

Application Example 4

This application example is directed to the electronic component of the above application example, wherein the first wiring board has flexibility.

Since the first wiring board has flexibility, it is possible to improve connectivity to the second wiring board.

Application Example 5

This application example of the invention is directed to an electronic device mounted with the electronic component.

According to this application example, since the electronic component is reduced in size, a limit in a circuit configuration is relaxed and a small circuit and a small electronic device mounted with the small circuit can be obtained.

Application Example 6

This application example of the invention is directed to a method of manufacturing an electronic component including; electrically connecting a second electrode of a semiconductor element, which includes a circuit and a first electrode and the second electrode provided on a first surface and electrically connected to the circuit, and a first wire of a first wiring board including the first wire; electrically connecting a vibration element to the first electrode and mounting the vibration element on the first surface side of the semiconductor element; and connecting the first wiring board and a second wiring board including a second wire including a connecting section of the first wiring board. In the mounting the vibration element, at least a part of an inner side region of an outer contour of the vibration element is arranged to overlap the second electrode in plan view facing the first surface.

According to this application example, since the second electrode to which the first wiring board is connected is formed in a mounting region of the vibration element and a connecting section to the second electrode of the first wiring board connected to the second electrode is connected to slip into between the vibration element and the semiconductor element in the mounting region of the vibration element, the semiconductor element can be reduced in size. Therefore, it is possible to use a smaller semiconductor element and realize a reduction in size of an electronic component and improvement of productivity of semiconductor elements (increase the number of semiconductor elements cut from one wafer).

Application Example 7

This application example is directed to the method of manufacturing an electronic component of the above application example, wherein the vibration element is mounted after the second electrode and the first wire of the first wiring board are connected.

According to this application example, it is possible to easily connect the second electrode and the first wiring board. Since the vibration element that tends to be broken is joined later, it is possible to suppress breakage of the vibration element during handling or the like.

BRIEF DESCRIPTION OF THE DRAWINGS

The invention will be described with reference to the accompanying drawings, wherein like numbers reference like elements.

FIGS. 6A and 6B are diagrams for explaining the manufacturing method according to the second embodiment, wherein FIG. 6A is an explanatory diagram of an element fixing plate and FIG. 6B is an explanatory diagram of element fixing.

FIG. 7A is a plan view and a side view for explaining the manufacturing method according to the second embodiment.

FIG. 7B is a plan view for explaining the manufacturing method according to the second embodiment.

DESCRIPTION OF EXEMPLARY EMBODIMENTS

Embodiments according to the present invention are explained below with reference to the drawings.

First Embodiment

Figure 1A:
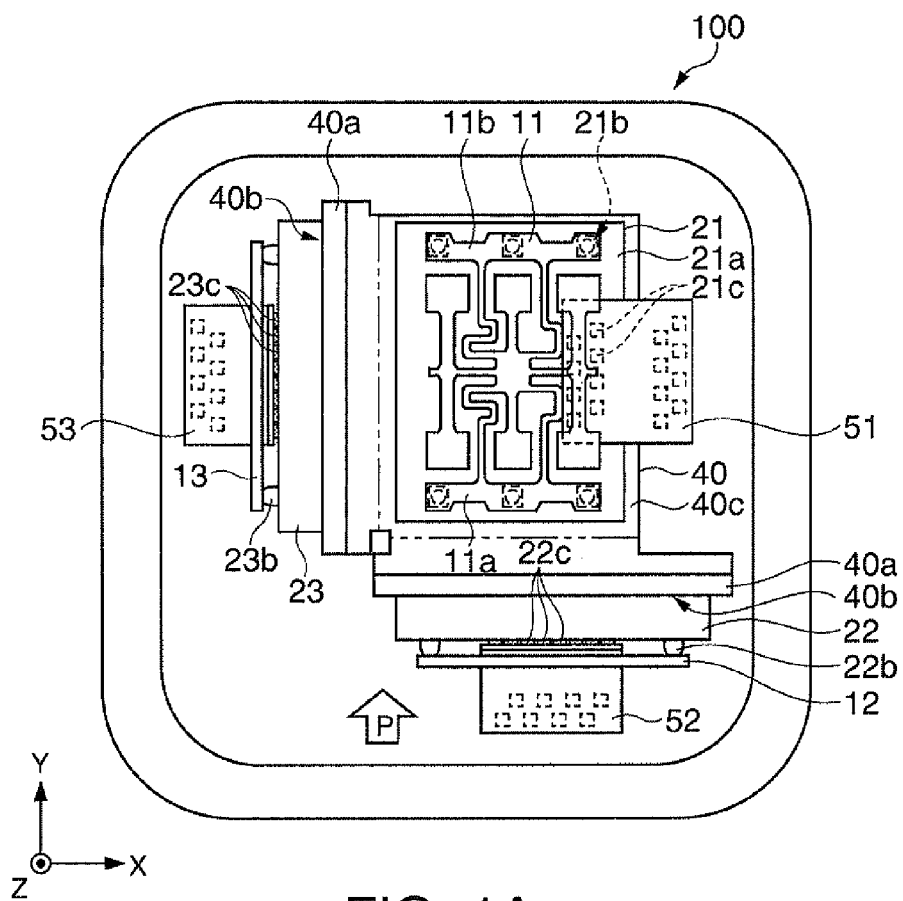
FIG. 1A is a plan view of an electronic component according to a first embodiment.
Figure 1B:
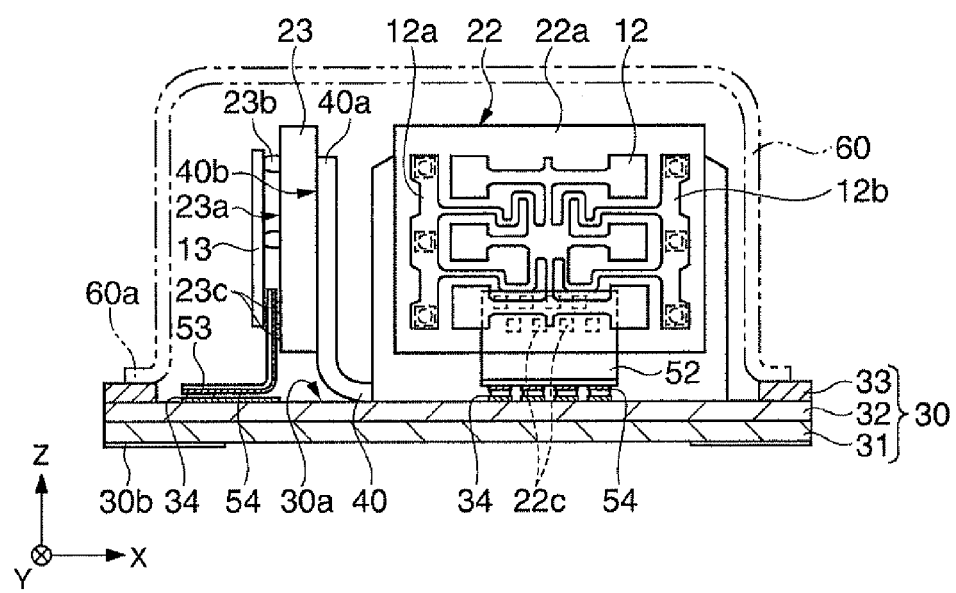
FIG. 1B is an arrow view of the electronic component viewed from an arrow P shown in FIG. 1A.

FIG. 1A is a plan view of an electronic component according to a first embodiment. FIG. 1B is an arrow view (a side view) of the electronic component viewed from an arrow P direction in FIG. 1A. For convenience of explanation, a cap 60 explained later is not shown in FIG. 1A. In FIG. 1B, the cap 60 is drawn by an imaginary line (an alternate long and two short dashes line).

As shown in FIGS. 1A and 1B, an electronic component 100 according to this embodiment is explained illustrating gyro sensor elements (hereinafter referred to as gyro vibration elements 11, 12, and 13) as vibration elements 11, 12, and 13. As explained in detail, later, the gyro vibration elements 11, 12, and 13 are fixed to semiconductor elements 21, 22, and 23 by closely attaching plural connection pads 21b, 22b, and 23b provided on active surfaces 21a, 22a, and 23a serving as first surfaces of the semiconductor elements 21, 22, and 23 and not-shown electrode wires arranged in supporting sections 11a, 11b, 12a, and 12b provided in the gyro vibration elements 11 and 12 and a not-shown supporting section provided in the gyro vibration element 13.

As shown in FIG. 1B, an element fixing plate 40 including rear plate sections 40a having surfaces 40b, which cross a mounting surface 30a, is fixedly attached to the mounting surface 30a of a second substrate 32 including the mounting surface 30a for an element on which wires (second wires) 34 of a substrate 30 serving as a second wiring board are formed. A semiconductor element 22 including a gyro vibration element 12 and a semiconductor element 23 including a gyro vibration element 13 are fixedly attached to one of the surfaces of the rear plate sections 40a of the element fixing plate 40, in this embodiment, surfaces 40b on the outer side. A semiconductor element 21 including a gyro vibration element 11 that detects inertial force with respect to rotation about a Z axis is fixedly attached to an opposite surface 40c of a surface fixed as the mounting surface 30a of the substrate 30 of the element fixing plate 40. A method of fixedly attaching the semiconductor elements 22 and 23 and the surfaces 40b of the rear plate sections 40a and a method of fixedly attaching the opposite surface 40c of the element fixing plate 40 and the semiconductor element 21 can be carried Out by an organic adhesive or the like. However, an adhesive is not specifically limited as long as the adhesive has electric insulating properties.

As explained above, the gyro vibration element 11 shown in FIG. 1A detects the inertial force with respect to the rotation about the Z axis. As shown in FIG. 1B, the gyro vibration element 12 is arranged to detect inertial force with respect to rotation about a Y axis and the gyro vibration element 13 is arranged to detect inertial force with respect to rotation about an X axis. In other words, the electronic component 100 is configured to be capable of detecting inertial forces with respect to the rotations in the three axis directions X, Y, and Z.

The semiconductor elements 21, 22, and 23 include external connection terminals 21c, 22c, and 23c functioning as second electrodes, for example, protruding electrodes formed in a bump shape by stud bump, paste, or the like. Connecting sections (parts of first wires 54) provided at one ends of FPCs (Flexible Print Circuit flexible boards) 51, 52, and 53 functioning as first wiring boards including the first wires 54 are joined to the external connection terminals 21c, 22c, and 23c. At the other ends of the FPCs 51, 52, and 53, external connection terminals are connected to external electrodes 30b by wires connected to the other parts of the first wires 54 and parts of the second wires 34 provided in the mounting surface 30a of the substrate 30 and drawn around in the substrate 30.

As shown in FIG. 1B, the active surfaces 22a and 23a of the semiconductor elements 22 and 23 are arranged to cross the mounting surface 30a of the substrate 30 by fixing the semiconductor elements 22 and 23 with the rear plate sections 40a of the element fixing plate 40. Since the active surfaces 22a and 23a are arranged in this way, in the FPCs 52 and 53 that connect the external connection terminals 22c and 23c of the semiconductor elements 22 and 23 and the mounting surface 30a, bent sections 52a and 53a (see FIGS. 6A and 6B) are formed by mounting the FPCs 52 and 53. Therefore, the FPCs 52 and desirably have flexibility. As a material having flexibility, polyimide is suitably used. However, the material is not limited to this.

As shown in FIG. 1A, the FPC 51 connected to the semiconductor element 21 is bent in a step section between the opposed surface 40c for element fixing of the element fixing plate 40 and the mounting surface 30a of the substrate 30. A bending angle is not large compared with a bending angle of the FPCs 52 and 53. However, since the semiconductor elements 21, 22, and 23 including the gyro vibration elements 11, 12, and 13 can have compatibility with one another, the FPC 51 also desirably has flexibility as explained above.

A fixing section 60a of the cap 60 is fixedly attached to a third substrate 33 to cover the gyro vibration elements 11, 12, and 13, the semiconductor elements 21, 22, and 23, the element fixing plate 40, and the FPCs 51, 52, and 53 arranged as explained above and keep the inside air tight. Consequently, the electronic component 100 is constructed.

Figure 2A:
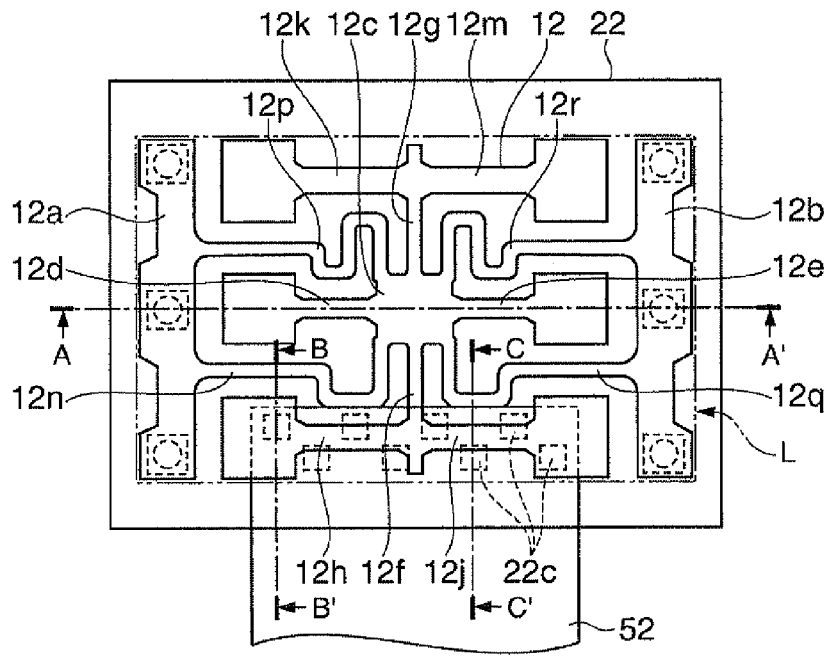
FIG. 2A is a plan view of an element configuration according to the first embodiment.
Figure 2B:
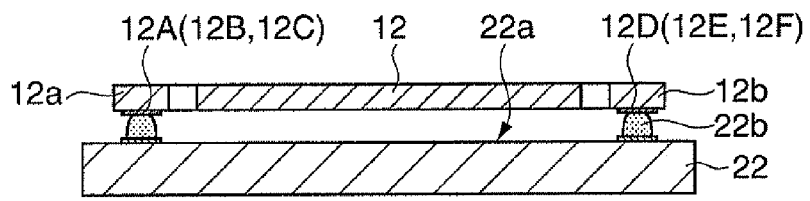
FIG. 2B is a sectional view of an A-A' section of FIG. 2A.
Figure 2C:
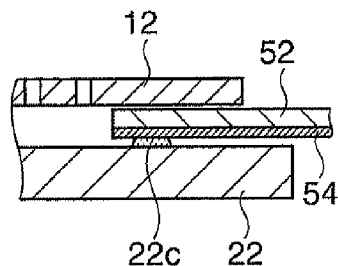
FIG. 2C is a sectional view of a B-B' section of FIG. 2A.
Figure 2D:
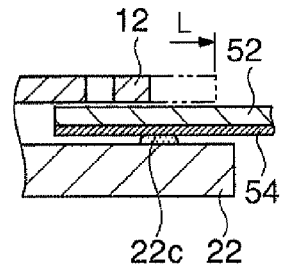
FIG. 2D is a sectional view of a C-C' section of FIG. 2A.

FIGS. 2A to 2D are schematic diagrams for explaining a relation among the gyro vibration element, the semiconductor element, and the FPC. FIG. 2A is a schematic plan view, FIG. 2B is a schematic sectional view of an A-A' section in FIG. 2A, FIG. 2C is a schematic sectional view of a B-E' section in FIG. 2A, and FIG. 2D is a schematic sectional view of a C-C' section in FIG. 2A. The gyro vibration element 12, the semiconductor element 22, and the FPC 52 are explained as an example with reference to FIGS. 2A to 2D. However, the same applies to the other gyro vibration elements 11 and 12, the other semiconductor elements 21 and 23, and the other FPCs 51 and 53.

As shown in FIG. 2A, the plural connection pads 22b that fix the gyro vibration element 12 to the semiconductor element 22 and are electrically connected to the gyro vibration element 12 are provided as protruding electrodes formed in a bump shape by stud bump, paste, or the like. In this embodiment, a gyro scope of a so-called double T type is explained as an example of the connected gyro vibration element 12. The gyro vibration element 12 is formed of, for example, quartz, has spread on a plane defined by an X axis and a Y axis of crystal axes of the quartz and has thickness in a Z axis direction.

The gyro vibration element 12 includes detection arms 12d and 12e extending from a base section 12c, driving arms 12h and 12j provided at the distal end of a coupling arm 12f extending from the base section 12c, and driving arms 12k and 12m provided at the distal end of a coupling arm 12g extending from the base section 12c. Further, the gyro vibration element 12 includes a supporting section 12a at the distal end of beams 12n and 12p extending from the base section 12c and a supporting section 12b at the distal end of beams 12q and 12r extending from the base section 12c.

Not-shown wires provided in the driving arms 12h, 12j, 12k, and 12m and the detection arms 12d and 12e are drawn around to the beams 12n, 12p, 12q, and 12r, connected to connection electrodes 12A, 12B, 12C, 12D, 12E, and 12F shown in FIG. 3 explained later formed in the supporting sections 12a and 12b shown in FIG. 2B, and connected to the connection pads 22b formed on the semiconductor element 22.

The external connection terminals 22c connected to the FPC 52 are formed on the active surface 22a of the semiconductor element 22. Like the connection pads 22b, protruding electrodes formed in a bump shape by stud bump, paste, or the like can be provided in the external connection terminals 22c. A connecting section (a part of the first wire 54) provided at one end of the FPC 52 is fixedly attached to the external connection terminal 22c. At the other end of the FPC 52, external connection terminals are connected to the other part of the first wire 54 and a part of the second wire 34 provided on the mounting surface 30a for elements of the substrate 30 and a signal is output to a circuit.

The arrangement of the external connection terminals 22c overlaps the external shape of the provided gyro vibration element 12 in plan view facing the active surface 22a of the semiconductor element 22. In FIG. 2C in which a B-B' section shown in FIG. 2A is shown, the external connection terminal 22c is arranged in a position overlapping the driving arm 12h of the gyro vibration element in plan view.

In FIG. 2O in which a C-C' section shown in FIG. 2A is shown, the external connection terminal 22c overlapping the driving arm 12h of the gyro vibration element in plan view and the external connection terminal 22e not overlapping the driving arm 12h are arranged. When an outer contour L including the external shape of the gyro vibration element 12 is defined, the external connection terminal 22c not overlapping the driving arm 12h is arranged on the inner side of the outer contour L, i.e., in a position overlapping an region surrounded by the outer contour L in plan view.

In this way, the external connection terminals 22c are formed on the inner side of the region surrounded by the outer contour L including the external shape of the gyro vibration element 12. The connection end of the FPC 52 is arranged and connected to slip into the gyro vibration element 12 to overlap the inner side of the region surrounded by the outer contour L, in other words, the gyro vibration element 12 in plan view. Consequently, the area of the active surface 22a of the semiconductor element 22 mounted with the gyro vibration element 12 can be reduced. In other words, it is possible to minimize the size (the external shape) of the semiconductor element 22 and further reduce the size of the electronic component 100 mounted with the semiconductor element 22.

The gyro vibration elements 11, 12, and 13 according to this embodiment are the gyro scopes of the double T type as explained above. Functions of the gyro vibration element 12 are explained with reference to FIG. 2A. The driving arms 12h, 12j, 12k, and 12m vibrate in-plane at a predetermined number of vibrations, with driving power input from connection electrodes provided in the supporting sections 12a and 12b in the semiconductor element 22. When the gyro vibration element 12 is rotated in a direction about an axis in the vertical direction with respect to the paper surface of FIGS. 2A to 2D in this state, Coriolis force is generated in the detection arms 12d and 12e The Coriolis force is detected as an electric signal by electrode films provided in the detection arms 12d and 12e. Inertial force in the rotating direction is calculated by the semiconductor element 22 and output to the outside.

The connection electrodes 12A, 12B, 12C, 12D, 12E, and 12F provided in the supporting sections 12a and 12b of the gyro vibration element 12 are formed on a surface opposed to the active surface of the semiconductor element 22. Wires formed in the vibration arms and the beams are not shown.

In the gyro vibration element 12, the wires (not shown) drawn around from the vibration arms and the detection arms as explained above are connected to the connection electrodes 12A, 12B, 12C, 12D, 12E, and 12F. As shown in FIG. 3, the connection electrodes 12A and 12D provided in positions close to the cap 60 are connection electrodes connected to electrodes provided in the detection arms 12d and 12e. The connection pads 22b of the semiconductor element 22 connected to correspond to the connection electrodes 12A and 12D are the connection pads 22b connected to a circuit that processes an inertial force detection signal of the semiconductor element 22.

As explained, the semiconductor element 22 is arranged on the substrate 30 such that the connection electrodes 12A and 12D for detection signals are arranged on the side close to the cap 60 of metal. Consequently, it is possible to suppress noise from being superimposed on the detection signals and obtain the electronic component 100 that can stably detect accurate inertial force.

In this embodiment, the gyro vibration elements 11, 12, and 13 are used as the vibration elements and the electronic component 100 detects inertial forces in the three axis directions. However, the vibration elements are not limited to this. For example, the vibration elements may be acceleration sensing elements that react to acceleration, pressure sensing elements that react to pressure, or weight sensing elements that react to weight. The principal planes of the vibration elements may only be arranged to cross the substrate 30 or the vibration elements arranged such that the principal planes thereof are parallel to the substrate 30 do not have to be provided.

Second Embodiment

Figure 4:
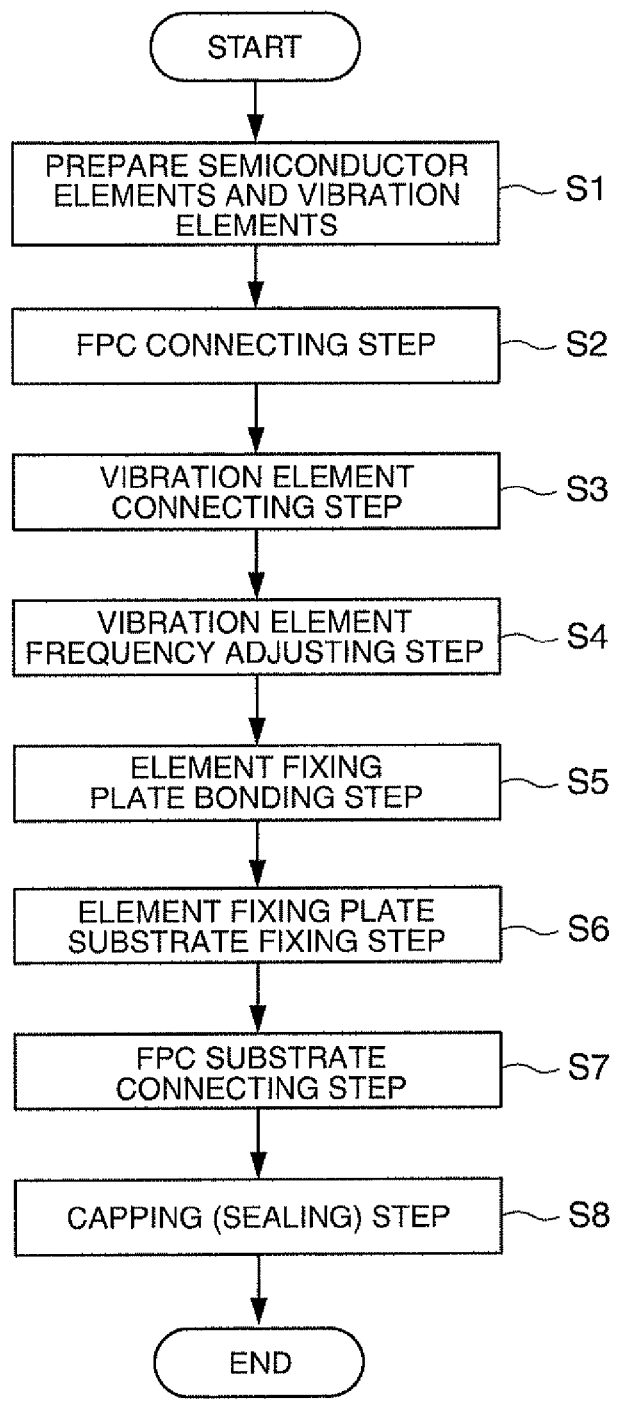
FIG. 4 is a flowchart for explaining manufacturing of an electronic component according to a second embodiment.

As a second embodiment, a method of manufacturing the electronic component 100 according to the first embodiment is explained. FIG. 4 is a flowchart for explaining the method of manufacturing the electronic component 100.

First, the semiconductor elements 21, 22, and 23 and the gyro vibration elements 11, 12, and 13 included in the electronic component 100 according to the first embodiment are prepared (S1). In step S1, the semiconductor elements 21, 22, and 23 on the active surfaces 21a, 22a, and 23a of which the connection pads 21b, 22b, and 23b, to which the gyro vibration elements 11, 12, and 13 are connected, and the external connection terminals 21c, 22c, and 23c, to which the FPCs 51, 52, and 53 are connected, are formed are prepared. The connection pads 21b, 22b, and 23b and the external connection terminals 21c, 22c, and 23c include, for example, protruding electrodes formed in a bump shape by stud bump, paste, or the like.

The gyro vibration elements 11, 12, and 13 are formed of, for example, quartz and include predetermined electrode wires. The FPCs 51, 52, and 53 include the first wires 54 including, at one ends, electrodes corresponding to the external connection terminals 21c, 22c, and 23c provided in the semiconductor element 21, 22, and 23. At the other ends, the first wires 54 include electrodes connected to electrodes of the second wires 34 provided on a substrate for package serving as a second wiring board explained later.

Figure 5A:
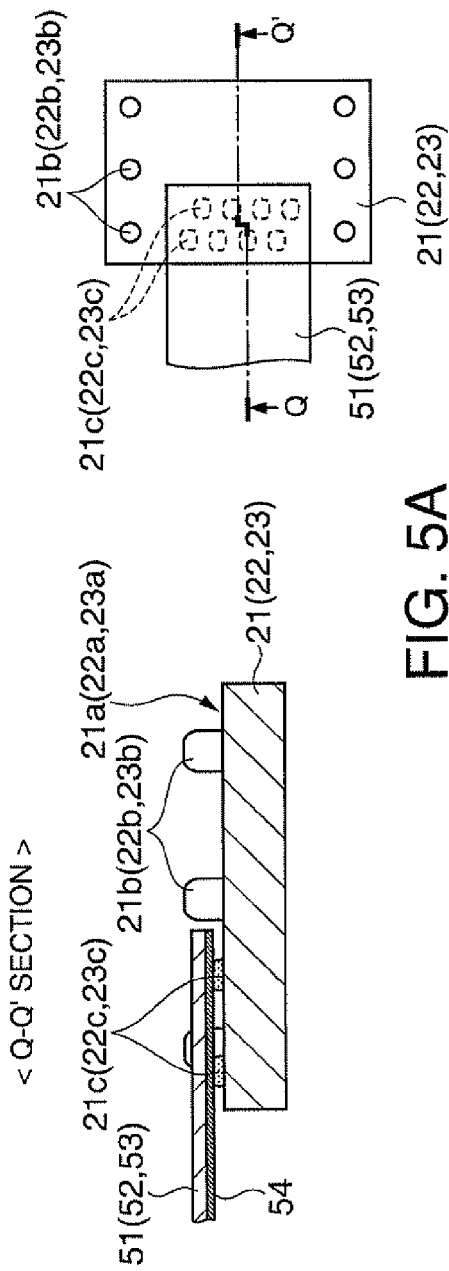
FIGS. 5A and 5B are sectional views and plan views for explaining a manufacturing method according to the second embodiment.

The processing shifts to a FPC connecting step (S2). In the FPC connecting step (S2), as shown in FIG. 5A, the external connection terminals 21c, 22c, and 23c formed on the active surfaces 21a, 22a, and 23a of the semiconductor elements 21, 22, and 23 and the first wires 54 provided at the ends of the FPCs 51, 52, and 53 are aligned and joined by ultrasonic compression bonding. A joining method is not limited to the ultrasonic compression bonding and may be appropriately selected from other publicly-known joining methods according to use of a connection terminal material, requested fixing quality, and the like. A base material for the FPCs 51, 52, and 53 is not specifically limited as long as the base material is a material having flexibility and insulating properties. However, polyimide is suitably used.

Figure 5B:
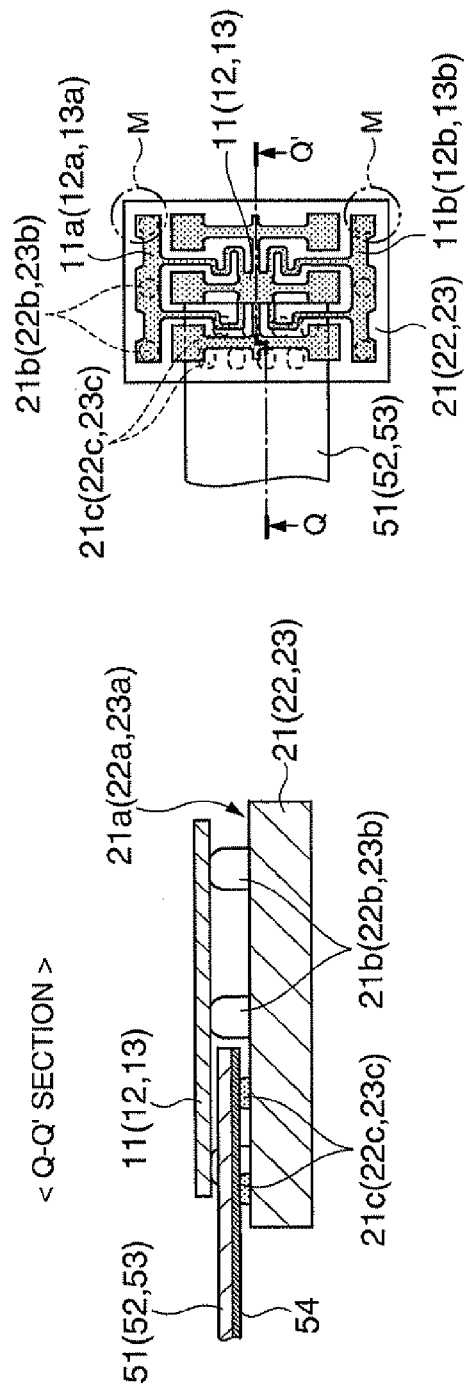

The processing shifts to a vibration element connecting step (S3) for mounting the gyro vibration elements 11, 12, and 13 on the semiconductor elements 21, 22, and 23 to which the FPCs 51, 52, and 53 are joined in the FPC connecting step (S2). As shown in FIG. 5B, in the vibration element connecting step S3, the gyro vibration elements 11, 12, and 13 are joined on the semiconductor elements 21, 22, and 23 to which the FPCs 51, 52, and 53 formed in step S2 are joined. As a joining method, the supporting sections 11a, 12a, 13a, 11b, 12b, and 13b of the gyro vibration elements 11, 12, and 13 are placed on the connection pads 21b, 22b, and 23b formed on the active surfaces 21a, 22a, and 23a of the semiconductor elements 21, 22, and 23. Not-shown connection electrodes of the gyro vibration elements 11, 12, and 13 formed on surfaces of the supporting sections 11a, 12a, 13a, 11b, 12b, and 13b opposed to the active surfaces 21a, 22a, and 23a side and the connection pads 21b, 22b, and 23b are electrically connected and fixedly attached by a conductive adhesive. The connection electrodes and the connection pads 21b, 22b, and 23b are not limited to the joining by the conductive adhesive and may be joined by a publicly-known connection method.

Figure 3:
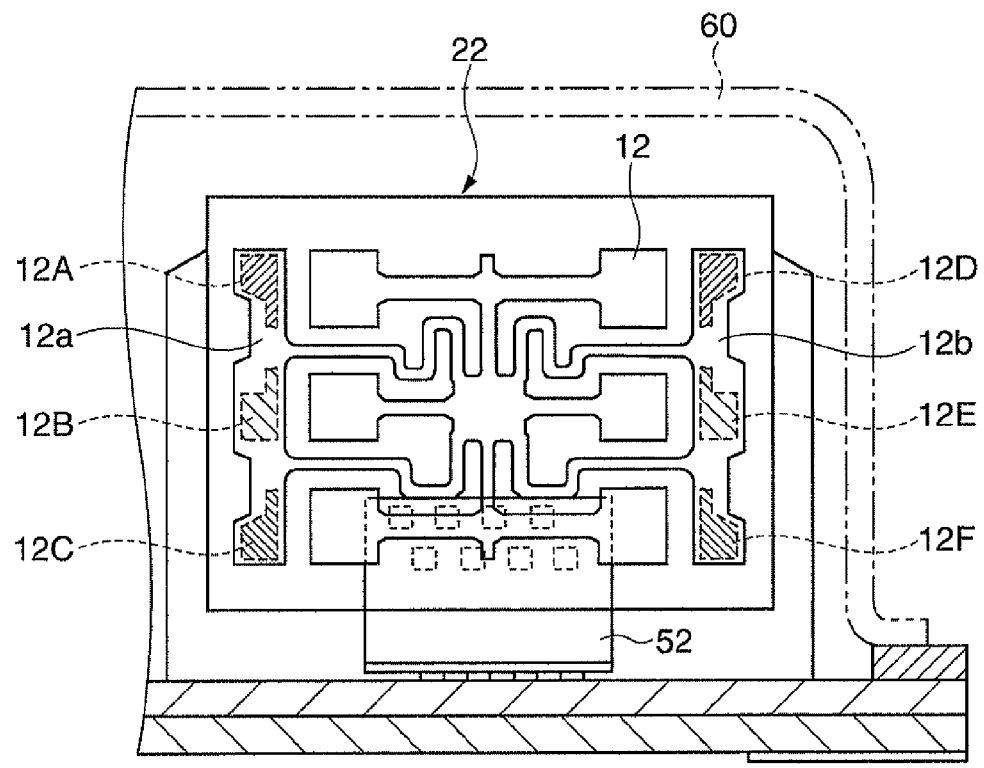
FIG. 3 is a front view of a connection electrode of a gyro oscillator according to the first embodiment.

In the vibration element connecting step (S3), the connection electrodes 12A and 12D drawn around from the detection arms 12d and 12e (see FIGS. 2A to 2D) as shown in FIG. 3 among the connection electrodes provided in the supporting sections 11a, 12a, 13a, 11b, 12b, and 13b of the gyro vibration elements 11, 12, and 13 are connected to connection pads in an M position shown in FIG. 5B such that the connection electrodes 12A and 12D are separated from the FPCs 51, 52, and 53.

The processing shifts to a vibration element frequency adjusting step (S4). In the vibration element frequency adjusting step (S4), electrode films or metal films for adjustment formed on the driving arms of the gyro vibration elements 11, 12, and 13, for example, in the case of the gyro vibration element 12, formed on the driving arms 12h, 12j, 12k, and 12m shown in FIGS. 2A to 2D are partially removed by a laser or the like. An oscillation frequency of the driving arms is adjusted to a predetermined frequency.

In the steps S2 to S4, manufacturing can be performed in a tape-like form on which the plural FPCs 51, 52, and 53 are formed. In the case of a method by this tape carrier, a step of cutting the tape into individual pieces in which the semiconductor elements 21, 22, and 23, the FPCs 51, 52, and 53, and the gyro vibration elements 11, 12, and 13 are assembled is provided after step S4.

The processing shifts to an element fixing plate bonding step (S5). In the element fixing plate bonding step (S5), the element fixing plate 40 shown in FIG. 6A is prepared in advance. The element fixing plate 40 is formed of a plate material of metal, for example, stainless steel, brass, or aluminum as explained below.

In the element fixing plate 40, a fixing section 40*d* bonded and fixed to the substrate 30 for mounting explained in FIGS. 1A and 1B is formed and the rear plate sections 40*a* are formed to cross the fixing section 40*d*. In this embodiment, the rear plate sections 40*a* are formed substantially perpendicularly on one side of the fixing section 40*d* to cross each other as shown in a plan view of FIG. 6A. By forming the fixing section 40*d* and the rear plate sections 40*a* in this way, the element fixing plate 40 including the rear plate section 40*a* on adjacent sides of the fixing section 40*d* as shown in an arrow S perspective view of FIG. 6A is obtained.

The element fixing plate bonding step (S5) is a step of bonding the semiconductor elements 21, 22, and 23 including the gyro vibration elements 11, 12, and 13 subjected to the frequency adjustment in step S4 to the element fixing plate 40. The bonding is carried out using an adhesive. In step S5, two units of the semiconductor elements 22 and 23 including the gyro vibration elements 12 and 13 are bonded to at least the rear plate sections 40*a*. A bonded state is shown in FIG. 63.

In step S5, surfaces opposite to the surfaces of the semiconductor elements 22 and 23 on which the gyro vibration elements 12 and 13 are mounted are aligned with and fixedly attached by an adhesive to the surfaces 40*b* facing outward of the rear plate sections 40*a* of the element fixing plate 40 shown in FIG. 6A. The adhesive is not specifically limited. However, for example, an epoxy adhesive excellent in bonding properties and insulating properties is suitable. After the semiconductor elements 22 and 23 and the rear plate sections 40*a* are bonded, the bent sections 52*a* and 53*a* in mounting the FPCs 52 and 53 to the substrate 30 are formed in advance.

As explained above, in step S5, the step of not bonding and fixing the semiconductor element 21 to a semiconductor element fixing surface 40*e* of the fixing section 40*d* fixedly attached to the substrate 30 of the element fixing plate 40 is illustrated. It is desirable to carry out the fixing of the semiconductor element 21 to the semiconductor element fixing surface 40*e* in an element fixing plate substrate fixing step (S6) explained later. However, the fixing of the semiconductor element 21 to the semiconductor element fixing surface 40*e* may be carried out in step S5. In that case, in the same manner as explained above, it is desirable to form a bent section in advance in the FPC 51 provided in the semiconductor element 21 as well.

The processing shifts to the element fixing plate substrate fixing step (S6). The element fixing plate substrate fixing step (S6) is a step of fixedly attaching the element fixing plate 40, on which the elements are assembled in step S5, to the substrate 30 for mounting prepared in advance. As shown in FIG. 7A, the substrate 30 serving as a second wiring board according to this embodiment has a three-layer structure formed by laminating a first substrate 31, a second substrate 32, and a third substrate 33. On the mounting surface 30*a* for elements of the second substrate 32, connection electrodes 30*c*, which are parts of the second wires 34 joined to the first wires 54 provided at the ends of the FPCs 51, 52, and 53, are formed. Not-shown wires drawn around to the external electrodes 30*b* formed on the bottom surface of the first substrate 31 from the connection electrodes 30*c* are formed on the first substrate 31 and the second substrate 32.

In the element fixing plate 40, the fixing section 40*d* is fixed in a predetermined position of the mounting surface 30*a* of the substrate 30 by an adhesive or the like. After the element fixing plate 40 is fixed to the substrate 30, as shown in FIG. 7B, the semiconductor element 21 mounted with the gyro vibration element 11 and the FPC 51 is fixedly attached to the semiconductor element fixing surface 40*e* of the fixing section 40*d* of the element fixing plate 40 by an adhesive.

The processing shifts to an FPC substrate connecting step (S7). In the FPC substrate connecting step (S7), connection electrode sections (not shown) provided at one ends of the FPCs 51, 52, and 53 shown in. FIG. 7B are connected to the connection electrodes 30*c* formed on the mounting surface 30*a* of the substrate 30. For the connection, as shown in a side view of FIG. 7A, an ultrasonic cone 70 is pressed against a connecting section to connect the connecting section with ultrasonic compression bonding. Since the connection electrodes 30*c* are formed on the mounting surface 30*a*, plural ultrasonic coned 70 can also be pressed against the connecting section to connect the connecting section.

Figure 8:
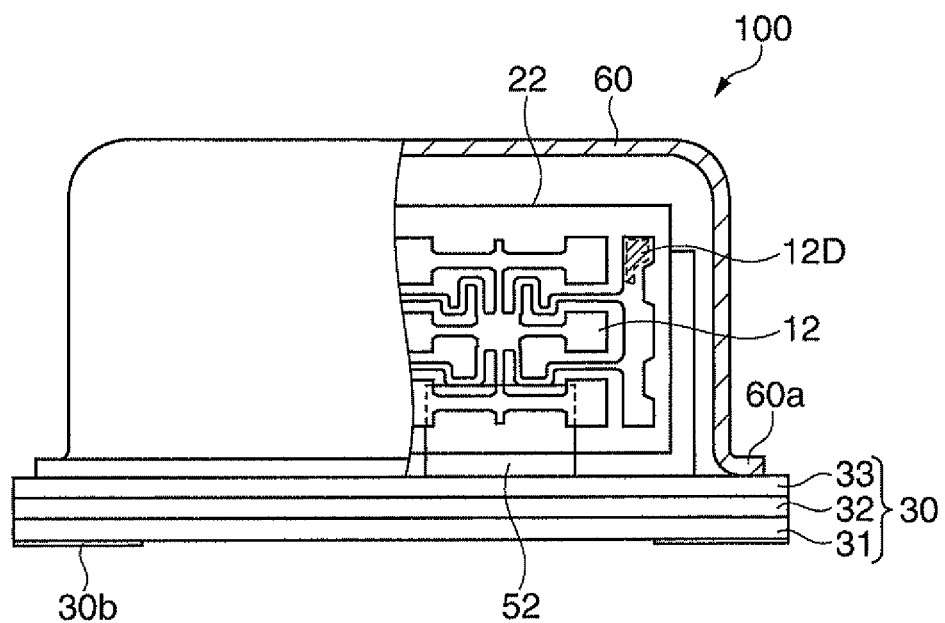
FIG. 8 is a side view for explaining the manufacturing method according to the second embodiment.

After step S7, the processing shifts to a capping (sealing) step (S8) The electronic component 100 according to this embodiment includes the gyro vibration elements 11, 12, and 13 as vibration elements. In order to stably vibrate the gyro vibration elements 11, 12, and 13, it is necessary to eliminate nitrogen, oxygen, and the like in the air, which are gas components around the elements that prevent vibration. Therefore, as shown in FIG. 8, in the capping (sealing) step (S8), the cap 60 air-tightly joined to the substrate 30 to cover the elements is fixedly attached. In FIG. 8, for convenience of explanation, a part of the cap 60 is cut and the elements on the inside are shown.

The cap 60 is made of metal such as stainless steel, titanium, or an alloy of stainless steel or titanium, or aluminum or an alloy of aluminum. Since seam welding is performed as a sealing and fixing method explained later, stainless steel is suitably used.

In the capping (sealing) step (S8), the cap 60 is placed on the substrate 30 mounted with the elements and sealed and fixed by seam welding over the entire periphery of the fixing section 60*a* of the cap 60 in a vacuum (decompressed) atmosphere. In this way, the electronic component 100 shown in FIG. 8 is completed.

When the elements are arranged in the electronic component 100 as explained above, as shown in FIG. 8, the connection electrode 12D (see FIG. 3) that transmits signals from the detecting arms provided in the supporting section 12*b* of the gyro vibration element 12 is arranged in a position close to the cap 60 apart from the substrate 30. Consequently, it is possible to suppress noise from being superimposed on the signals from the detection arms.

As explained above, in the past, after the gyro vibration elements 11, 12, and 13 are joined and fixed to the semiconductor elements 21, 22, and 23, the FPCs 51, 52, and 53 are joined to the semiconductor elements 21, 22, and 23. However, as in this embodiment, the semiconductor elements 21, 22, and 23 and the FPCs 51, 52, and 53 are joined before joining of the gyro vibration elements 11, 12, and 13, i.e., in a state (a form) in which the gyro vibration elements 11, 12, and 13 that tend to be broken are not provided. This makes it possible to substantially improve the quality and the yield of the electronic component 100.

Further, after the FPCs 51, 52, and 53 are joined to the semiconductor elements 21, 22, and 23, work such as conveyance, attachment, and the like of components in a state of an FPC tape is performed. Since the vibration elements that tend to be broken are not mounted, it is possible to suppress component breakage.

Electronic Device

The electronic component 100 according to the first embodiment can be mounted on an electronic device such as a camera shake detection sensor for a digital camera or a digital video photographing machine or a motion sensor that senses a posture for posture control. When the acceleration sensing element that reacts to acceleration is used, the electronic component 100 can be mounted on an acceleration sensor incorporated in a car navigation system or the like. When the pressure sensing element is used, the electronic component 100 can be mounted on a pressure sensor. When the weight sensing element is used, the electronic component 100 can be mounted on a weight sensor.

What is claimed is:

1. An electronic component comprising:
    a semiconductor element including a circuit;
    a vibration element;
    a first electrode that is arranged on a first surface of the semiconductor element, and the first electrode being connected to the circuit and the vibration element arranged on the first surface side;
    a second electrode that is arranged on the first surface, at least a part of an inner side region of an outer contour of the vibration element being arranged to overlap the second electrode in plan view facing the first surface;
    a first wiring board that includes a first wire connected to the second electrode; and
    a second wiring board including a second wire to which the first wire is connected,
    wherein the semiconductor element is disposed on a plane perpendicular to the second wiring board and the first wiring board in a side view.

2. The electronic component according to claim 1, wherein a wiring surface of the second wiring board on which the second wire is formed and the first surface of the semiconductor element are arranged to cross each other.

3. The electronic component according to claim 1, further comprising a metal member that covers the semiconductor element and the vibration element and is connected to the second wiring board, wherein
    the first surface of the semiconductor element is a rectangle having a first side and a second side opposed to the first side,
    a distance between the second side and the metal member is shorter than a distance between the first side and the metal member,
    the first electrode includes a third electrode for signals that detects vibration of the vibration element and is arranged closer to the second side than the first side, and
    the second electrode is located closer to the first side than the second side.

4. The electronic component according to claim 1, wherein the first wiring board has flexibility.

5. An electronic device mounted with the electronic component according to claim 1.

6. The electronic component according to claim 1, wherein the vibration element is a gyroscopic vibration element.

7. The electronic component according to claim 1, wherein the first wiring board and the second wiring board are disposed outside of the semiconductor element.

8. The electronic component according to claim 1, wherein the second wiring board is a flexible substrate and the semiconductor element is disposed on the second wiring board.

9. The electronic component according to claim 1, wherein the first wiring board has a first end extending between the vibrating element and the second electrode, and a second end extending beyond a periphery of the semiconductor element.

10. The electronic component according to claim 1, wherein the first wiring board has a first end at which the first wire is connected to the second electrode and a second end at which the second wire is connected to the first wire, the first wiring board bending in between the first end and the second end.

11. A method of manufacturing an electronic component comprising:
    electrically connecting a second electrode of a semiconductor element, which includes a circuit and a first electrode and the second electrode provided on a first surface and electrically connected to the circuit, and a first wire of a first wiring board including the first wire;
    electrically connecting a vibration element to the first electrode and mounting the vibration element on the first surface side of the semiconductor element; and
    connecting the first wiring board and a second wiring board including a second wire including a connecting section of the first wiring board, the semiconductor element being disposed on a plane perpendicular to the second wiring board and the first wiring board in a side view, wherein
    in the mounting the vibration element, at least a part of an inner side region of an outer contour of the vibration element is arranged to overlap the second electrode in plan view facing the first surface.

12. The method of manufacturing an electronic component according to claim 11, wherein the vibration element is mounted after the second electrode and the first wire of the first wiring board are connected.

13. The method of manufacturing an electronic component according to claim 11, wherein in the mounting the vibration element on the first surface side of the semiconductor element, the first wiring board is arranged such that a first end of the first wiring board extends between the vibrating element and the second electrode, and a second end extends beyond a periphery of the semiconductor element.

14. The method of manufacturing an electronic component according to claim 11, wherein in the electrically connecting the second electrode of the semiconductor element and the first wire of the first wiring board, the first wiring board has a first end at which the first wire is connected to the second electrode, and
    wherein in the connecting the first wiring board and the second wiring board, the first wiring board has a second end at which the second wire is connected to the first wire, the first wiring board bending in between the first end and the second end.

* * * * *